(12) United States Patent
Chung

(10) Patent No.: US 7,002,381 B1
(45) Date of Patent: Feb. 21, 2006

(54) SWITCHED-CAPACITOR CONTROLLER TO CONTROL THE RISE TIMES OF ON-CHIP GENERATED HIGH VOLTAGES

(75) Inventor: Michael S. C. Chung, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/015,033

(22) Filed: Dec. 11, 2001

(51) Int. Cl.
H03K 4/06 (2006.01)

(52) U.S. Cl. .................. 327/131; 327/540; 327/170
(58) Field of Classification Search ............. 327/540, 327/554, 291, 299, 293, 294, 170, 131, 132, 327/126, 536, 537; 363/60, 59; 323/282; 307/110
See application file for complete search history.

(56) References Cited

U.S. PATENT DOCUMENTS

| | | | |
|---|---|---|---|
| 4,752,699 A | * | 6/1988 | Cranford, Jr. et al. ...... 327/100 |
| 5,006,974 A | * | 4/1991 | Kazerounian et al. ....... 363/60 |
| 5,168,174 A | * | 12/1992 | Naso et al. .................. 327/540 |
| 5,539,351 A | * | 7/1996 | Gilsdorf et al. ............. 327/379 |
| 5,703,807 A | * | 12/1997 | Smayling et al. ...... 365/185.03 |
| 6,259,612 B1 | * | 7/2001 | Itoh ............................. 363/60 |
| 6,469,482 B1 | * | 10/2002 | Jahanshir et al. ........... 323/282 |
| 6,492,862 B1 | * | 12/2002 | Nakahara ..................... 327/536 |
| 6,628,151 B1 | * | 9/2003 | Zhou et al. .................. 327/134 |

OTHER PUBLICATIONS

Z.H. Meiksin, Electronic Design with off-the-Shelf Integrated Circuits, 1984, Prentice_Hall Inc. pp. 336-339, 2nd Edition.*

* cited by examiner

Primary Examiner—Tuan T. Lam
Assistant Examiner—Hiep Nguyen

(57) ABSTRACT

A switched capacitor controller accurately controls the rise time of an on-chip generated high voltage. An on-chip charge pump is used to generate a high voltage (VPP) from an external power supply voltage (VCC). This high voltage signal (VPP) can be used to program Flash memory cells. A capacitor of a switched capacitor circuit is selectively switched between ground and a given node voltage. This generates a stair-stepped ramp function. The period of the steps is controlled according to a clock signal. This clock signal may be altered to produce the desired period. The voltage increases of the steps is regulated by a reference voltage multiplied by a ratio between two capacitor values. Thereby, the rise-time of the ramp function is accurately controlled as a function of the frequency of the clock signal and the ratio of the two capacitor values.

14 Claims, 4 Drawing Sheets

SWITCHED-CAPACITOR CONTROLLER TO CONTROL THE RISE TIMES OF ON-CHIP GENERATED HIGH VOLTAGES

TECHNICAL FIELD

The present invention relates to a switched-capacitor circuit for controlling the rise times of on-chip generated high voltages.

BACKGROUND ART

Non-volatile memory chips are used in a wide variety of electrical applications, computers, communications devices, consumer electronics, and any other application where data must be retained when power is no longer being supplied. Flash erasable programmable read-only memory (EPROM) chips are non-volatile memory chips which also offer the ability of being programmed and erased. In order to program and erase these flash EPROM chips, high voltages varying from 10 to 16 volts are typically required to perform the programming and erasing operations. These high voltages are commonly referred to as Vpp. The high voltages are usually generated on the flash EPROM chips based on an externally supplied low voltage power suppy (Vcc). Circuitry, such as "charge pumps," on the flash EPROM chip take the Vcc power supply voltage and outputs the requisite higher Vpp voltage. The charge pumps are basically voltage multiplication circuits, and the techniques for their construction are well known to those skilled in the non-volatile memory arts.

It is oftentimes desirable to control the rise times (e.g., ramp rate) of the on-chip generated high voltages (i.e., Vpp) for flash EPROMs. This is due to the fact that if the rise time of Vpp were too fast, it may impose undue stress on the flash EPROM memory core cells when the Vpp is applied to the control gate of the cell during channel hot electron programming or programming via Fowler-Nordheim tunneling.

Therefore, there exists a need for a circuit or method which is capable of accurately control the rise time of an on-chip generated high voltage or Vpp. The present invention offers a unique, novel solution which is especially relevant to Flash EPROM and other non-volatile memories which require high voltages for their program and/or erase procedures.

DISCLOSURE OF THE INVENTION

The present invention pertains to a switched-capacitor circuit for accurately controlling the rise times of on-chip generated high voltages. An on-chip charge pump is used to generate a high voltage (VPP) from an external power supply voltage (VCC). This high voltage signal (VPP) can be used to program Flash memory cells. The capacitor of a switched capacitor circuit is selectively switched between ground and a given node voltage. This produces a stair-stepped ramp function. The period of the steps is controlled according to a clock signal or oscillator. The frequency of this clock signal may be altered to generate the desired period. The voltage increases of the steps is regulated by a reference voltage multiplied by a ratio between two capacitor values. Thereby, the switched capacitor system accurately controls the rise-time of the VPP signal as a function of the frequency of the clock signal and the ratio of the two capacitor values.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

The present invention pertains to a switched-capacitor circuit for controlling the rise times of on-chip generated high voltages. In the following detailed description of the present invention, numerous specific details are set forth in order to provide a thorough understanding of the present invention. However, it will be obvious to one skilled in the art that the present invention may be practiced without these specific details or by using alternate elements or methods. In other instances well known methods, procedures, components, and circuits have not been described in detail as not to unnecessarily obscure aspects of the present invention.

Figure 1:
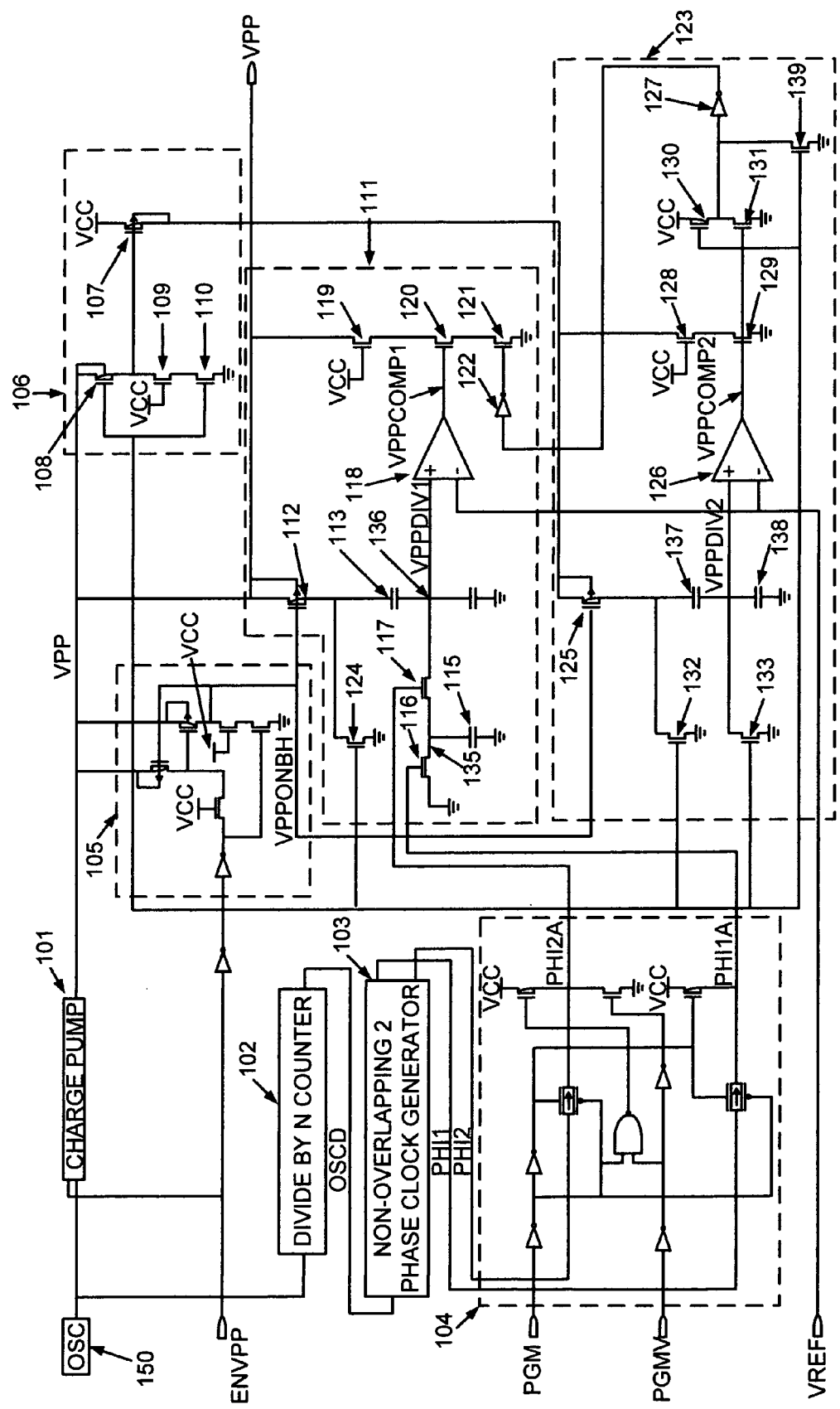
FIG. 1 shows a circuit diagram of the currently preferred embodiment of the present invention.

Referring to FIG. 1, a circuit diagram of the currently preferred embodiment of the present invention is shown. The circuit comprises a charge pump 101. Alternatively, a voltage multiplication circuit may be implemented in place of the charge pump 101. The charge pump 101 is typically comprised of a series of MOS diode connected transistors and coupling capacitors driven by two-phase non-overlapping clocks generated from a primary clock signal OSC. The OSC signal is usually the output of an on-chip ring oscillator circuit 150. The OSC signal is also input to the divide by N counter 102. The divide by N counter 102 is a binary digital counter that performs a "divide by N" function where N is a power of two. The output from the divide by N counter 102 is a clock signal, OSCD, whose frequency is equal to that OSC divided by N where $N=2^M$, with being the width in bits of the binary counter represented by the counter. The OSCD output from the divide by N counter 102 is fed as an input to the non-overlapping two-phase clock generator 103. The clock generator 103 generates two non-overlapping clock phases, PHI1 and PHI2, which have the same frequency as the output from the counter 102. The two non-overlapping clock phase signals are input to block 104. Block 104 creates two "gated" versions of the PHI1 and PHI2 signals, referred to as PHI1A and PHI2A. The PHI1A and PHI2A signals are controlled by the control signals PGM and PGMV. When both PGM and PGMV are low, both PHI1A and PHI2A are pulled up to logic high (e.g., $V_{CC}$). When PGMV is high and PGM is low, PHI1A is pulled up to $V_{CC}$ while PHI2A is grounded. Finally, when PGMV is low and PGM is high, PHI1A is logically equivalent to PHI1 while PHI2A is equivalent to PHI2. In other words, when PGM is high and PGMV is low, PHI1A and PHI2A function as a pair of non-overlapping two phase clock signals. It should be noted that, by design, there will never be a situation whereby both PGM and PGMV are both high. Circuit block 105 comprises a voltage level shifter that converts the control signal ENVPP to a level shifted inverted signal, VPPONBH.

Circuit block 106 comprises a "keeper" device 107 which is controlled by the high-voltage inverter made up of devices 108, 109, and 110. When the control signal ENVPP is low, the gate of "keeper" device 107 is grounded and node VPP is kept at VCC. When ENVPP goes high, the gate of device 109 is connected to VPP and device 109 behaves as a reverse biased diode-connected transistor, and the connection from VCC to VPP is broken. This allows VPP to be pumped up by the charge pump 101 when ENVPP goes high.

Circuit block 111 is a constant ramp generator. It contains a P-channel pass transistor 112, a capacitor divider network, and a switched capacitor network. More specifically, the capacitor divider network is comprised of capacitor 113 and capacitor 114. The switched capacitor network is comprised of capacitor 115 connected to a pair of NMOS pass devices 116 and 117. The NMOS pass devices 116 and 117 are driven by the pair of non-overlapping clock phase signals PHI1A and PHI2A. Also included in circuit block 111 is a high gain CMOS comparator 118 and an NMOS pull down stack made up of devices 119, 120, and 121. An inverter 122 is driven by the input signal VPOK which is output from circuit block 123. Also included is an initialization device 124.

Circuit block 123 is used to detect the final voltage. It is comprised of a P-channel pass device 125, a capacitor divider network, a high gain 1 CMOS comparator 126, an NMOS pull down stack, a pseudo PMOS inverter, a CMOS inverter 127, and initialization devices. The NMOS pull down stack is comprised of devices 128 and 129. The pseudo PMOS inverter is comprised of devices 130 and 131. And the initialization devices include transistors 132, 133, and 134.

The operation of the entire system is now described in detail. The beginning of a high voltage programming operation is signified by the control input signal ENVPP going high from a previous low state. At the same time, the PGMV signal is activated (e.g., brought to VCC) to first initiate a Program Verify operation. This is done to verify whether the selected bits are already in a programmed state. If they are, then the subsequent program or PGM operation will be skipped. During the Program Verify phase, PHIA is high while PHI2A is grounded. Hence, the node 135 in circuit block 111 is grounded and at the same time, capacitor 115 is isolated from node 136 of circuit block 111. The feedback loop consisting of comparator 118 and pull-down devices 119, 120, and 121 forces VPP to be regulated to a value given by the equation:

$$VPP_1 = VREF\left(\frac{C_1 + C_{2A}}{C_1}\right)$$

where $C_1$=capacitance of capacitor 113 and $C_{2A}$=capacitance of capacitor 114. Simultaneously, the regulation circuitry inside circuit block 123 is also active. The comparator and capacitor divider network of capacitors 137 and 138 and the rest of the circuitry (including devices 128 and 129) attempt to regulate VPP to a value given by:

$$VPP_2 = VREF \cdot \left(\frac{C_3 + C_4}{C_3}\right)\ldots$$

where $C_3$=capacitance of capacitor 137 and $C_4$=capacitance of capacitor 138.

However, the values of capacitors 113, 114, 137, and 138 are chosen such that:

$$\left(\frac{C_3 + C_4}{C_3}\right) > \left(\frac{C_1 + C_{2A}}{C_1}\right)$$

Therefore, during Program Verify, VPP is regulated to the smaller value given by VPP1 of the first equation given above. It should be noted that VPP2 sets the upper limit of VPP during the program phase when VPP is ramped up from the VPP1 value in a controlled fashion. During the Program Verify (PGMV) phase then, VPPCOMP2 of circuit block 123 stays low and the VPOK signal also stays low since VPPDIV2 is always less than VREF during PGMV.

At the conclusion of the PGMV phase, assuming that the selected bits are not all programmed already, a program (PGM) phase is launched during which PGMV is grounded and the PGM signal is asserted high.

During PGM, the PHI1A and PHI2A function as a pair of non-overlapping clock phases. The capacitor 115 of circuit block 111 is then periodically switched between VSS (ground) and node 136. It should be noted that capacitor 115 can be approximated by an equivalent resistor connected between node 136 and VSS with a value given by:

$$R_{EQ} = \frac{T_{SW}}{C_2}$$

where Tsw is the period of either PHI1A or PHI2A, and where $C_2$=capacitance of capacitor 115.

Now, invoking the "virtual ground" concept at the inputs of comparator 118 of circuit block 111, it can be determined that the regulation feedback loop in circuit block 111 forces the average current flowing from VPPDIV1 to VSS (ground) through the switched capacitor 115 as represented by its equivalent resistor to a value as given by:

$$I_{AV} = \frac{VREF}{R_{EQ}} = \frac{VREF \cdot C_2}{T_{SW}}$$

Since $I_{AV}$ is also flowing through the capacitor 113, whose bottom plate is held at a fixed average value of VREF, the voltage on its top plate (VPP) must be changing at a rate given by:

$$\left\langle\frac{dVPP}{dt}\right\rangle = \frac{I_{AV}}{C_1}$$

Substituting the two equations, one comes up with the following equation:

$$\left\langle\frac{dVPP}{dt}\right\rangle = \left(\frac{C_2}{C_1}\right)\left(\frac{VREF}{T_{sw}}\right)$$

In both of the two above equations, the notation < > denotes the time average of the quantity contained inside the angular brackets. From the earlier discussion:

$$T_{SW} = \frac{T_{OSC}}{N}$$

where Tosc is the period of the on-chip ring oscillator driving the charge pump 101.

Figure 2:
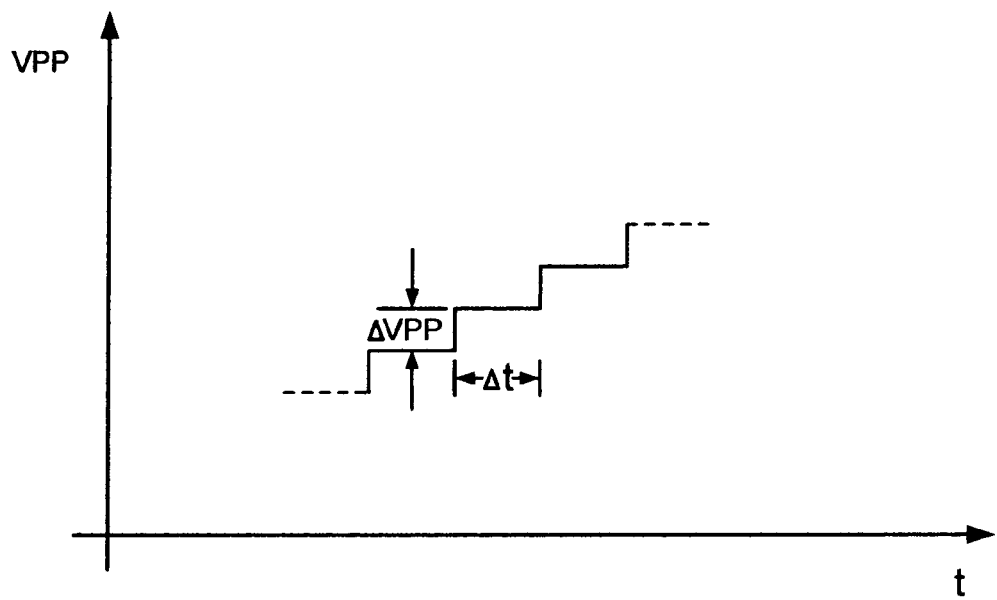
FIG. 2 shows an actual shape of the VPP during the PGM phase.

The actual shape of the VPP during the PGM phase is a staircase as shown schematically in FIG. 2. It can be seen that:

$$\Delta VPP = VREF \cdot \left(\frac{C_2}{C_1}\right); \ldots$$

$$\Delta t = T_{SW} = \frac{T_{OSC}}{N}; \ldots$$

From the equations above, one can calculate $$\left\langle \frac{dVPP}{dt} \right\rangle$$

is a function of a ratio of the two capacitances C2 and C1 and also of Tosc. Since (C2/C1) is expected to be highly insensitive to process, temperature and power supply variations, the only sensitivity to these variables lies in Tosc, which is the period of the on-chip ring oscillator.

During the PGM phase, VPP will keep increasing with an average dVPP/dt until VPP reaches a value given by VPP2, at which time VPPCOMP2 will reach an average value high enough to drive VPOK to VCC. When this happens, device 121 will be turned off and the feedback loop in circuit block 111 will be broken and the circuit block 111 will no longer be able to control VPP. The regulation loop in circuit block 123 then takes over and regulates or clamps VPP to a constant final value given by VPP2 given in the previous equation. After a pre-determined time interval has expired, the PGM signal is brought low, signifying the end of the program phase. The ENVPP signal is then brought low, discharging VPP back down to VCC. After a sufficient amount of discharge time has elapsed, PGMV and ENVPP are again activated to initiate another Program Verify operation to check whether the previous PGM operation was successful or not. If unsuccessful, another PGM phase can be launched, and the whole PGMV-PGM-PGMV cycle is repeated. During each PGM phase, VPP will be pumped up from its value of VPP1 (attained using the PGMV phase) with <dVPP/dt> until it reaches VPP2.

Figure 3:
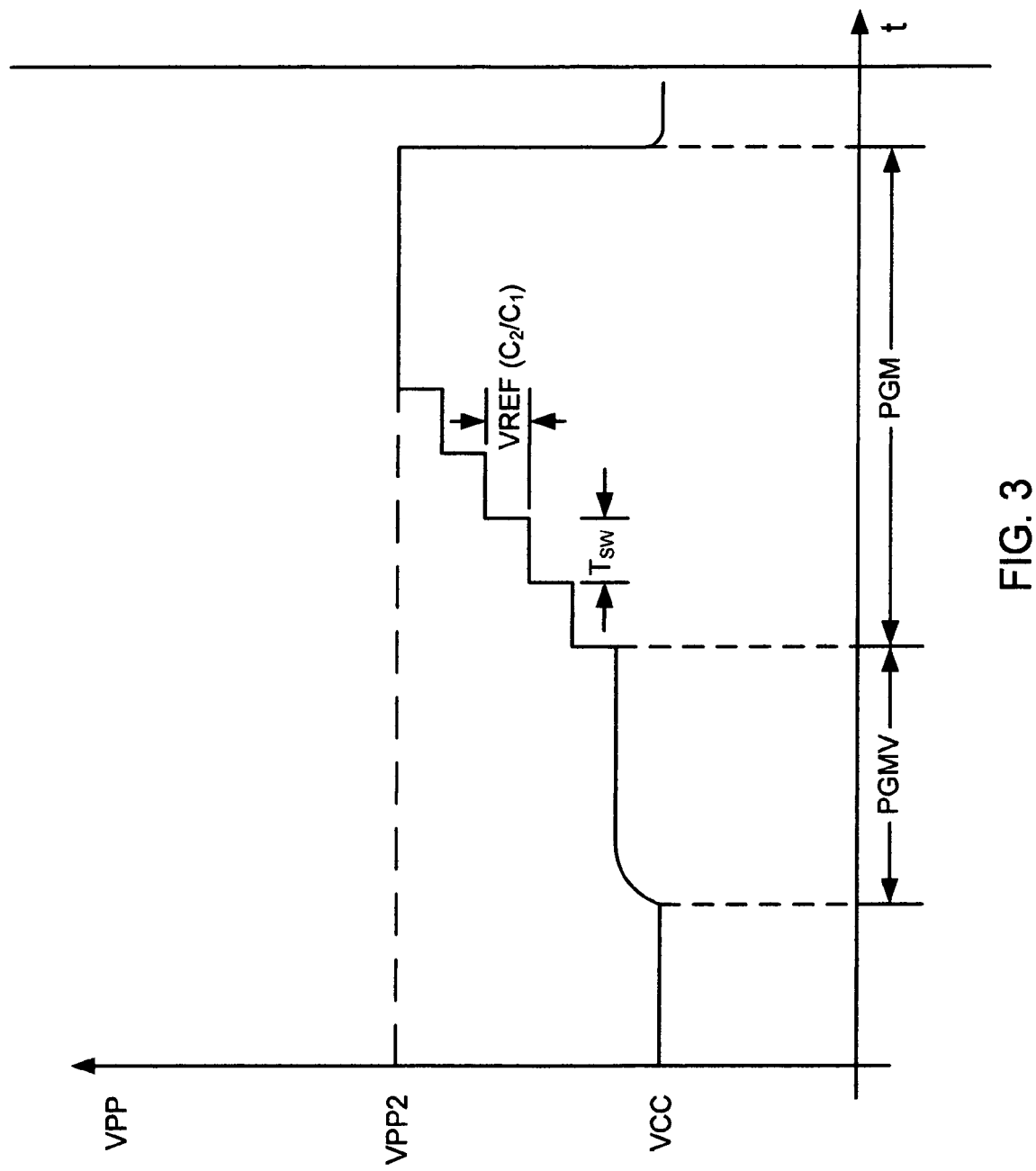
FIG. 3 shows a plot of the VPP waveform through one PGMV-PGM cycle.

FIG. 3 shows a plot of the VPP waveform through one PGMV-PGM cycle. It can be seen that the signal starts at VCC, increases during PGMV, and then increases incrementally in a stair-step fashion with the value of each step given by $V_{REF}*(C2/C1)$. The period of each step is given by $T_{sw}$. The voltage is then clamped at VPP2 for the remainder of the PGM cycle.

Figure 4:
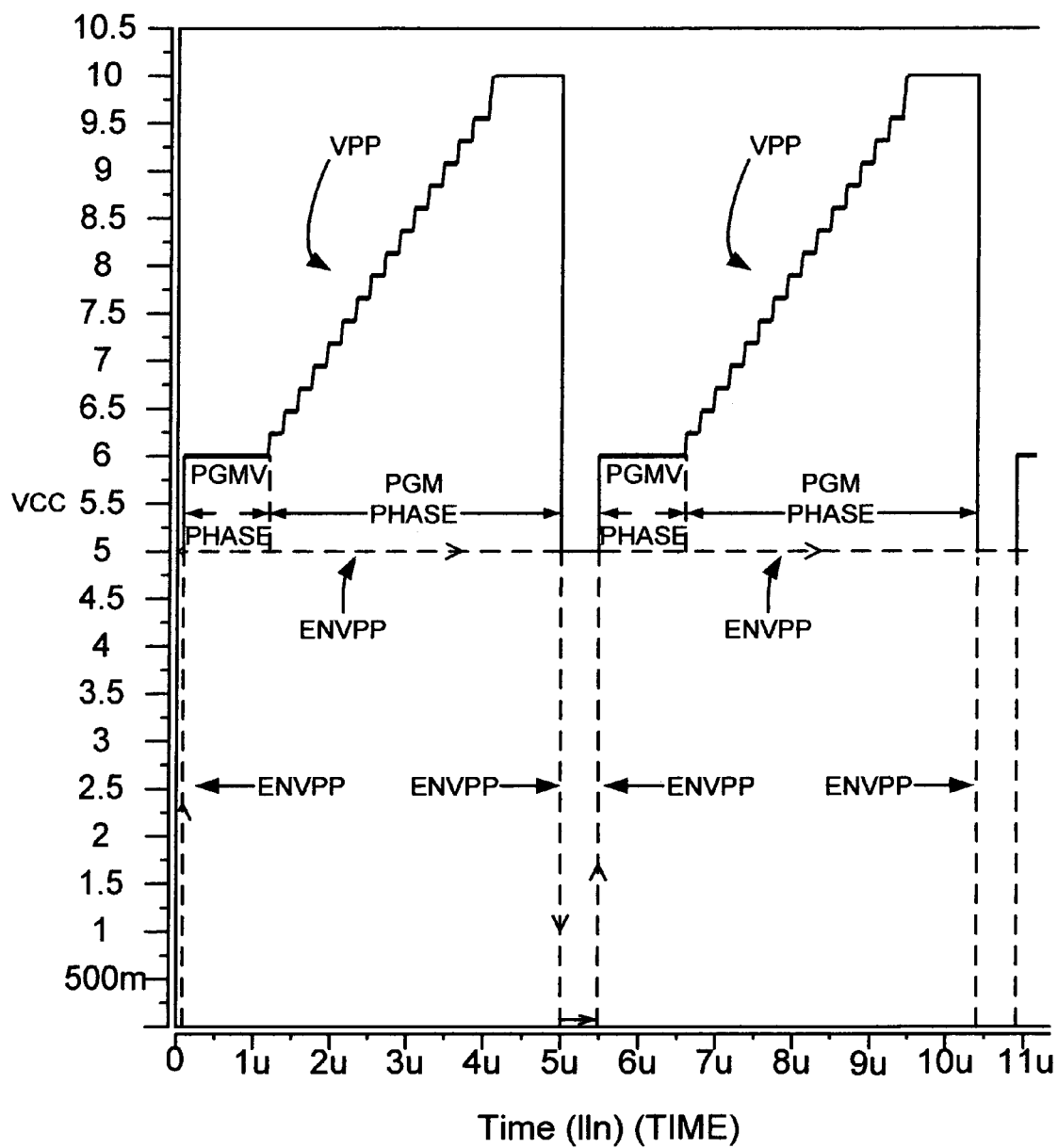
FIG. 4 shows exemplary outputs from a VPP generator with rise-time control using a switched capacitor system according to the currently preferred embodiment of the present invention.

FIG. 4 shows exemplary outputs from a simulation of the VPP generator with rise-time control using a switched capacitor system according to the currently preferred embodiment of the present invention. Right after time t=0, the ENVPP control signal goes from 0 volts to 5 volts. It stays at 5 volts for 5 microseconds. At which point, the ENVPP control signal drops back down to 0 volts for half a microsecond. It then goes back up to 5 volts for another 5 microseconds. This process can repeat. At the same time, right after time t=0, the PGMV phase initiates at a constant 6 volts. Upon initiation of the PGM phase, the VPP voltage ramps up in a stair-case pattern up to 10 volts. At the conclusion of the PGM phase, the voltage falls back down to 5 volts until the next PGMV phase begins anew. Again, this process can repeat.

Therefore, a switched-capacitor circuit for controlling the rise times of on-chip generated high voltages is described. While the present invention has been described in particular embodiments, it should be appreciated that the present invention should not be construed as limited by such embodiments, but rather construed according to the below claims.

What is claimed is:

1. A circuit for controlling the rise time of a signal, comprising:
   a voltage multiplication circuit for converting an input voltage corresponding to said signal to an output voltage greater than said input voltage;
   a ramp generator coupled to said voltage multiplication circuit for controlling said output voltage from said voltage multiplication circuit, wherein a ratio between a first capacitor of said ramp generator and a second capacitor of said ramp generator determines said rise time of said signal, wherein said signal comprises a staircase ramp signal;
   a divide by N counter coupled to said ramp generator for generating a plurality of clock phases wherein said ramp generator is controlled with said clock phases; and
   a keeper device coupled to said voltage multiplication circuit for allowing said voltage multiplication circuit to selectively hold said signal at a supply voltage and, upon enabling, to perform said converting.

2. The circuit of claim 1, wherein said voltage multiplication circuit comprises a charge pump.

3. The circuit of claim 1, wherein said signal is used to program and erase Flash EPROM cells.

4. The circuit of claim 1 further comprising a level shifter.

5. The circuit of claim 1 further comprising two non-overlapping clock signals.

6. The circuit of claim 1 further comprising a ring oscillator coupled to said ramp generator.

7. The circuit of claim 1 further comprising a capacitor divider network coupled to a switched capacitor network.

8. The circuit of claim 7, wherein said switched capacitor network switches between ground potential and potential of a node of said capacitor divider network.

9. The circuit of claim 8, wherein said node is coupled to a CMOS comparator.

10. A switched capacitor controller for controlling a rise time of an on-chip generated voltage source, comprising:
    a charge pump for converting an input voltage corresponding to said signal to an output voltage greater than said input voltage;
    a ramp generator coupled to said charge pump, wherein said ramp generator comprises a switched capacitor network;
    a regulator circuit coupled to said switched capacitor network circuit which causes a capacitor to switch between ground potential and the potential at a node, wherein a stair-step ramp signal is generated and said rise time is controlled with said switched capacitor, wherein said switched capacitor network comprises two capacitors wherein said rise time is controlled according to a ratio of capacitances of said two capacitors;

an oscillator coupled to said charge pump which generates an oscillating signal to said charge pump; and a keeper device coupled to said charge pump for selectively allowing said charge pump to hold said signal at a supply voltage and, upon enabling, to perform said converting.

11. The switched capacitor controller of claim 10 further comprising:

a divider coupled to said oscillator;

a non-overlapping two phase clock generator coupled to said divider.

12. The switched capacitor controller of claim 10, wherein said ramp generator further comprises a capacitor divider network.

13. In a flash memory, a method for controlling a rise time of an on-chip generated voltage source used to program said flash memory, comprising:

generating a programming voltage VPP for programming a cell of flash memory from a power supply via a ring oscillator, wherein said programming voltage is selectively greater than a supply voltage VCC from said power supply upon enabling and held to said supply voltage VCC without said enabling;

activating a program control signal PGM to enable programming of said cell of said flash memory;

generating a stair-case ramp corresponding to said programming voltage VPP in response to said program control signal PGM, wherein steps of said stair-case ramp have a period corresponding to a clock signal generated by a clock generator and voltage increases corresponding to a reference voltage times a ratio of two capacitor values.

14. The method of claim 13 further comprising switching a capacitor between ground potential and the potential at a node to generate said stair-case ramp.

* * * * *